United States Patent
Perales et al.

(10) Patent No.: US 10,555,431 B2
(45) Date of Patent: Feb. 4, 2020

(54) METHOD FOR CONTROLLING THE ASSEMBLY OF A PRINTED CIRCUIT BOARD BY RIVETING

(71) Applicants: Continental Automotive France, Toulouse (FR); Continental Automotive GmbH, Hannover (DE)

(72) Inventors: Pierre Perales, Calmont (FR); Chantal Cron, Castelginest (FR)

(73) Assignees: Continental Automotive France, Toulouse (FR); Continental Automotive GmbH, Hannover (DE)

(*) Notice: Subject to any disclaimer, the term of this patent is extended or adjusted under 35 U.S.C. 154(b) by 5 days.

(21) Appl. No.: 16/062,751

(22) PCT Filed: Dec. 12, 2016

(86) PCT No.: PCT/EP2016/002095
§ 371 (c)(1),
(2) Date: Jun. 15, 2018

(87) PCT Pub. No.: WO2017/102075
PCT Pub. Date: Jun. 22, 2017

(65) Prior Publication Data
US 2019/0343014 A1 Nov. 7, 2019

(30) Foreign Application Priority Data

Dec. 18, 2015 (FR) ...................... 15 62732

(51) Int. Cl.
*B60R 16/02* (2006.01)
*H05K 7/14* (2006.01)
*H05K 1/02* (2006.01)

(52) U.S. Cl.
CPC ........... *H05K 7/1417* (2013.01); *B60R 16/02* (2013.01); *H05K 1/0269* (2013.01);
(Continued)

(58) Field of Classification Search
CPC .................................................. B60R 16/02
(Continued)

(56) References Cited

U.S. PATENT DOCUMENTS

| 6,347,038 B1 | 2/2002 | Duarte et al. |
| 6,951,467 B1 * | 10/2005 | Hansen ................... H01R 4/06 439/82 |
| 2007/0188692 A1 | 8/2007 | Fukusako et al. |

FOREIGN PATENT DOCUMENTS

| EP | 1087652 A1 | 3/2001 |
| FR | 2741505 A1 | 5/1997 |

OTHER PUBLICATIONS

English translation of the Written Opinion for International Application No. PCT/EP2016/002095, dated Apr. 7, 2017, 4 pages.
(Continued)

*Primary Examiner* — Stanley Tso
(74) *Attorney, Agent, or Firm* — RatnerPrestia

(57) ABSTRACT

A method for mounting a printed circuit board for an automotive vehicle on a carrier structure including at least one rivet. The printed circuit board includes at least one mounting aperture that is capable of accommodating the rivet and which defines an electrical conduction zone and at least one mark having a control end up to which the mark extends over the electrical conduction zone. The method includes a step of positioning the printed circuit board on the carrier structure such that the rivet extends through the mounting aperture, a step of riveting the rivet such that its head is at least partly flattened on the electrical conduction zone and a step of determining the conformity of riveting when the head of the rivet covers the control end of the mark.

10 Claims, 3 Drawing Sheets

(52) U.S. Cl.
CPC .............. *H05K 2201/09054* (2013.01); *H05K 2201/09918* (2013.01); *H05K 2201/09936* (2013.01); *H05K 2201/10598* (2013.01); *H05K 2203/163* (2013.01); *H05K 2203/166* (2013.01)

(58) Field of Classification Search
USPC ........................................................ 174/250
See application file for complete search history.

(56) References Cited

OTHER PUBLICATIONS

International Search Report and Written Opinion for International Application No. PCT/EP2016/002095, dated Apr. 7, 2017—7 pages.

* cited by examiner

METHOD FOR CONTROLLING THE ASSEMBLY OF A PRINTED CIRCUIT BOARD BY RIVETING

CROSS REFERENCE TO RELATED APPLICATIONS

This application is the U.S. National Phase Application of PCT International Application No. PCT/EP2016/002095, filed Dec. 12, 2016, which claims priority to French Application No. 1562732, filed Dec. 18, 2015, the contents of such applications being incorporated by reference.

FIELD OF INVENTION

The present invention relates to the field of printed circuit boards for automotive vehicle computers and more particularly pertains to a method for controlling the assembly of a printed circuit board for an automotive vehicle computer by riveting.

BACKGROUND OF THE INVENTION

An automotive vehicle comprises, in a known manner, a plurality of on-board computers, each allowing one or more items of equipment of the vehicle to be controlled.

It is thus known practice to use, for example, an on-board computer to control operating parameters of the engine (such as the injection), an on-board computer to control electrical parameters of the vehicle, an on-board computer to control the steering assist system of the vehicle, etc.

Conventionally, an on-board computer takes the form of a housing in which a printed circuit board is mounted. It is known practice to mount this printed circuit board on the housing by screwing; however, mounting it in this way is time-consuming and costly. Moreover, the use of screws makes the logistics more complex. Therefore, a proposed solution to these problems is to mount the printed circuit board by riveting.

To do this, a rivet is inserted into each mounting aperture of the printed circuit board before being riveted. Such a rivet has two functions: a first function of attaching the printed circuit board to the housing and a second, electrical conduction function so as to allow the electrical continuity of the ground between the printed circuit board and the housing. Therefore, it is important to check the conformity of riveting.

Specifically, poor riveting may result in defects such as mechanical fragility of the mounting and/or a contact area that is insufficient when it comes to providing good electrical continuity to ground. Poor riveting may manifest as non-conformal flattening or else the rivet being off-center in the aperture of the printed circuit board, in which cases the contact area between the printed circuit board and the rivet is not sufficient.

Moreover, controlling the riveting of a printed circuit board, which makes it possible to check the diameter of the rivet and its centering in the aperture, can be time-consuming and imprecise.

SUMMARY OF THE INVENTION

An aspect of the invention therefore aims to overcome these drawbacks, at least in part, by providing a simple, effective and reliable solution for controlling the riveting of a printed circuit board so as to detect riveting defects.

To this end, one subject of an aspect of the invention is a method for mounting a printed circuit board, preferably a computer printed circuit board, for an automotive vehicle on a carrier structure for said printed circuit board, said carrier structure comprising at least one rivet, said rivet comprising a head that is capable of being flattened so as to attach the printed circuit board to the carrier structure, the printed circuit board comprising at least one mounting aperture that is capable of accommodating said rivet and which defines an electrical conduction zone and at least one mark comprising a control end up to which said mark extends over said electrical conduction zone, the method comprising:

a step of positioning the printed circuit board on the carrier structure such that the rivet extends through the mounting aperture;

a step of riveting the rivet such that its head is at least partly flattened on the electrical conduction zone; and a step of determining the conformity of riveting when the head of the rivet covers the control end of the mark.

By virtue of the mounting method according to an aspect of the invention, the control of the riveting of the printed circuit board is straightforward and reliable by virtue of the coverage of the control end of the mark by the head of the rivet.

Preferably, the determining step is performed by a human operator. Manual determination of this type is thus straightforward to set up and requires no additional elements.

Preferably, a module for determining the conformity of riveting is used in the step of determining the conformity of riveting, the step of determining the conformity of riveting being performed automatically by said determining module.

Again preferably, the determining module comprises at least one camera and one analysis submodule, the step of determining the conformity of riveting comprising a substep of the camera acquiring at least one image of the head of the rivet and a substep of the analysis submodule analyzing the image to determine the coverage of the control end of the mark by the head of the rivet. Automatic determination is thus straightforward to set up.

Another subject of an aspect of the invention is a printed circuit board, preferably for an automotive vehicle computer, the circuit board comprising an aperture for mounting on a carrier, an electrical conduction zone on the periphery of said mounting aperture, the printed circuit being, noteworthy in that it comprises at least one mark comprising a control end up to which said mark extends over the electrical conduction zone so as to control the conformity of riveting of the printed circuit board according to the method described above.

Preferably, the printed circuit board is at least partly covered by a protective layer, preferably made of varnish, defining the electrical conduction zone.

Again preferably, the mark extends from said protective layer.

According to one aspect of the invention, the mark extends from the mounting aperture.

According to another aspect of the invention, the mark is made of varnish so as to affix it easily and permanently to the printed circuit board.

The color of the mark may be different from that of the body of the printed circuit board so as to make it clearly visible for an operator or a camera during the determination of the conformity of riveting.

Advantageously, the printed circuit board comprises a plurality of marks distributed evenly around the mounting aperture so as to determine the conformity of centering or riveting of the printed circuit board.

Preferably, the printed circuit board comprises three or four marks distributed evenly around the mounting aperture so as to precisely determine the conformity of centering or riveting of the printed circuit board while keeping the manufacture of the printed circuit board straightforward and inexpensive.

Another subject of an aspect of the invention is a computer for an automotive vehicle, comprising a printed circuit board such as described above and at least one rivet for attaching the printed circuit board, said rivet covering the control end so as to easily control the conformity of riveting.

An aspect of the invention also relates to an automotive vehicle comprising a computer such as presented above.

Lastly, an aspect of the invention relates to a system comprising a printed circuit board such as described above, riveted to a carrier, and to a module for determining the conformity of riveting, said determining module being configured to automatically determine the conformity of riveting when the head of the rivet covers the control end of the mark.

Preferably, the determining module comprises at least one camera configured to acquire a plurality of images of the head of the rivet and an analysis submodule configured to analyze a plurality of images acquired by the camera and to determine the coverage of the control end of the mark by the head of the rivet.

BRIEF DESCRIPTION OF THE DRAWING

Other features and advantages of aspects of the invention will emerge during the following description given with reference to the appended figures, which are given by way of nonlimiting example and in which identical references are given to similar objects.

DETAILED DESCRIPTION OF THE PREFERRED EMBODIMENTS

In what follows, by way of example, an injection computer for an automotive vehicle is presented. It will be noted that such an application does not limit the scope of the present invention which may be applied to any type of computer, to any type of vehicle and, more broadly, to any application requiring a printed circuit board to be mounted on a carrier by a rivet in the automotive field.

As is known, an injection computer is designed to control the injection of fuel into the engine of the vehicle.

Figure 1:
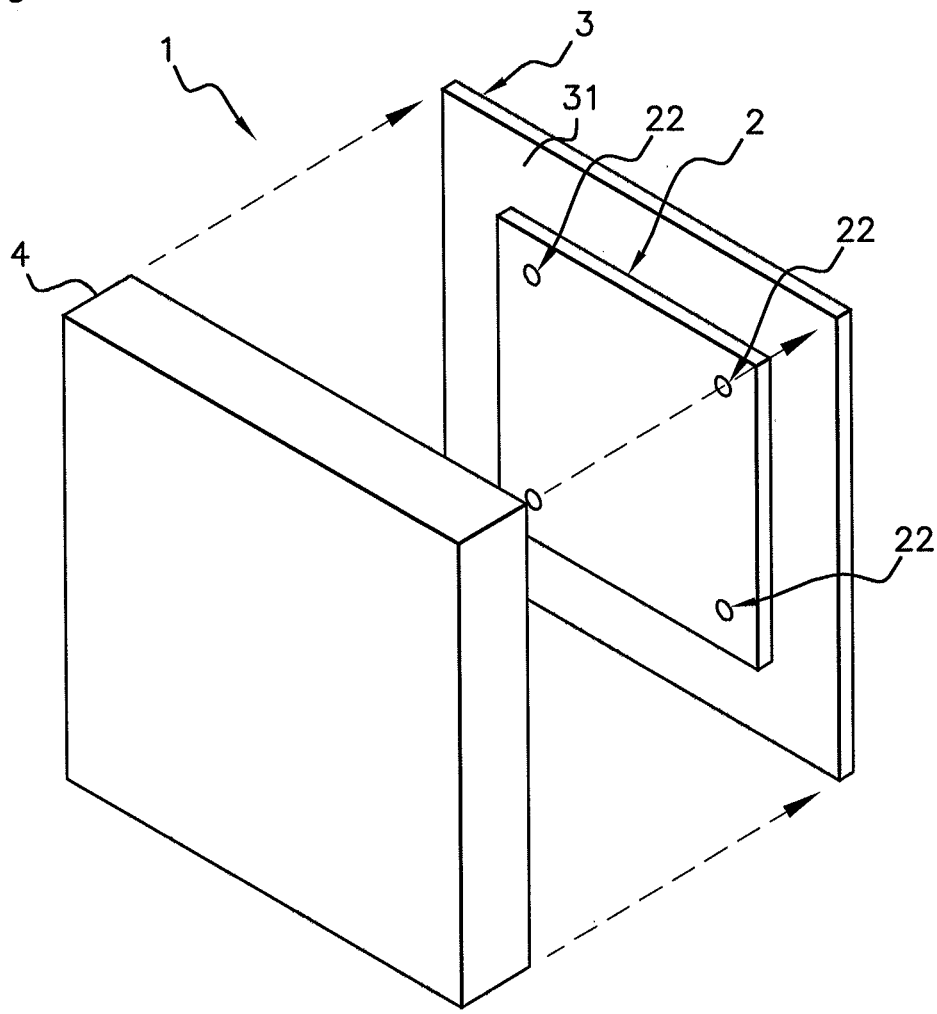
FIG. 1 schematically shows an automotive vehicle computer.

With reference to FIG. 1, the injection computer 1 comprises a printed circuit board 2 protected by a protective housing comprising a carrier structure 3 for the printed circuit board 2 and a cover 4 suitable for covering the printed circuit board 2 so as to protect it.

Figure 2:
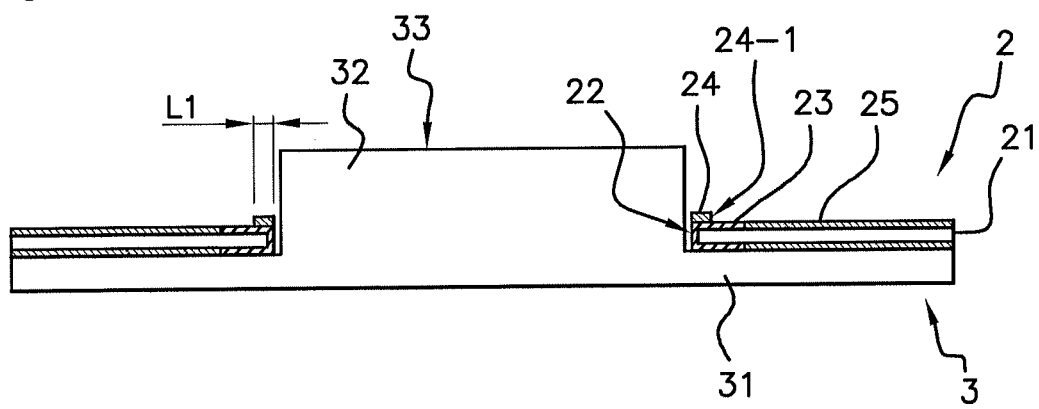
FIG. 2 schematically shows a sectional view of a first embodiment of a printed circuit board for the computer of FIG. 1.

With reference to FIG. 2, the carrier structure 3 comprises a substantially planar main body 31, on which the printed circuit board 2 is mounted, and a plurality of rivets 32 for attaching the printed circuit board 2.

Each rivet 32 extends orthogonally to the main body 31 up to a free end referred to as the head 33 of the rivet 32, so as to pass through a mounting aperture 22 of the printed circuit board 2 as will be presented below. A rivet 32 may be made of the same material as the main body 31 or else be an additional element added to the main body 31.

During the riveting operation, the head 33 of the rivet 32 is deformed by flattening so as to widen it to prevent the rivet 32 from exiting the mounting aperture 22 and thus to hold the printed circuit board 2 on the carrier structure 3. Optionally, when attaching the printed circuit board 2 to the carrier structure 3, thermal paste (not shown) is applied between the printed circuit board 2 and the carrier structure 3 so as to allow the conduction of the heat generated by the printed circuit board 2.

The cover 4 is mounted on the carrier structure 3 so as to form the protective housing for the printed circuit board 2. A seal (not shown) may be mounted between the cover 4 and the carrier structure 3 so as to ensure the leak tightness of the protective housing.

Still with reference to FIG. 2, the printed circuit board 2 comprises a core 21, a plurality of mounting apertures 22, an electrical conduction zone 23 extending to the periphery of each mounting aperture 22 and a plurality of marks or guides 24. In this example, the printed circuit board 2 further comprises a protective layer 25 for protecting the core 21.

The core 21 consists of one or more layers of copper that are insulated from one another. Each copper layer is etched, in a known manner, so as to form the tracks of the printed circuit board 2 connecting various electronic components. The core 21 is covered by a protective layer 25 so as protect the tracks from oxidation and from shorting. In this example and in a known manner, the protective layer 25 consists of a varnish.

The mounting apertures 22 allow the printed circuit board 2 to be attached to the housing by cooperating with the rivets 32. Each mounting aperture 22 is defined by an electrical conduction zone 23 extending to its periphery so as to provide electrical ground continuity between the printed circuit board 2 and the carrier structure 3 via the associated rivet 32.

Each mark 24 of the printed circuit board 2 extends at least partly over the electrical conduction zone 23 up to a control end 24-1 so as to allow riveting to be controlled. Such a mark 24 thus constitutes a guide allowing the position of the rivet 32 in the mounting aperture 22 to be controlled.

Figure 3:
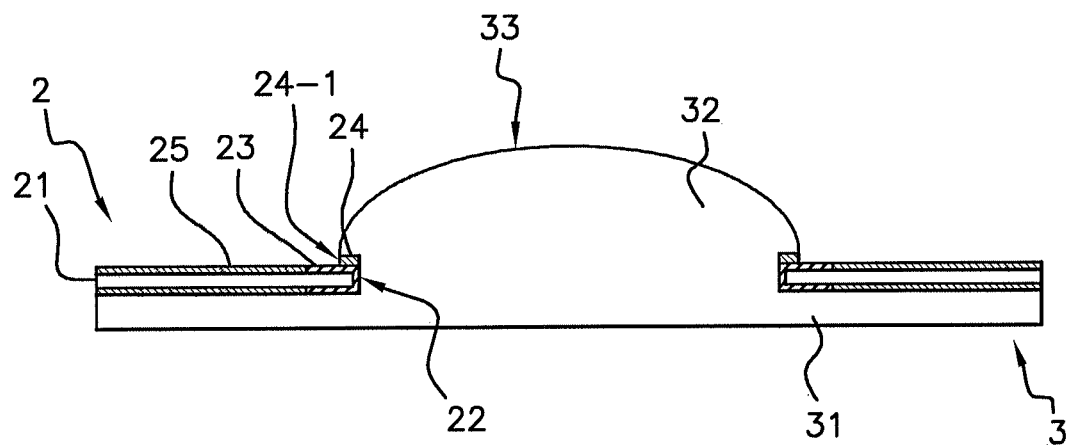
FIG. 3 schematically shows the printed circuit board of FIG. 2 riveted.
Figure 4:
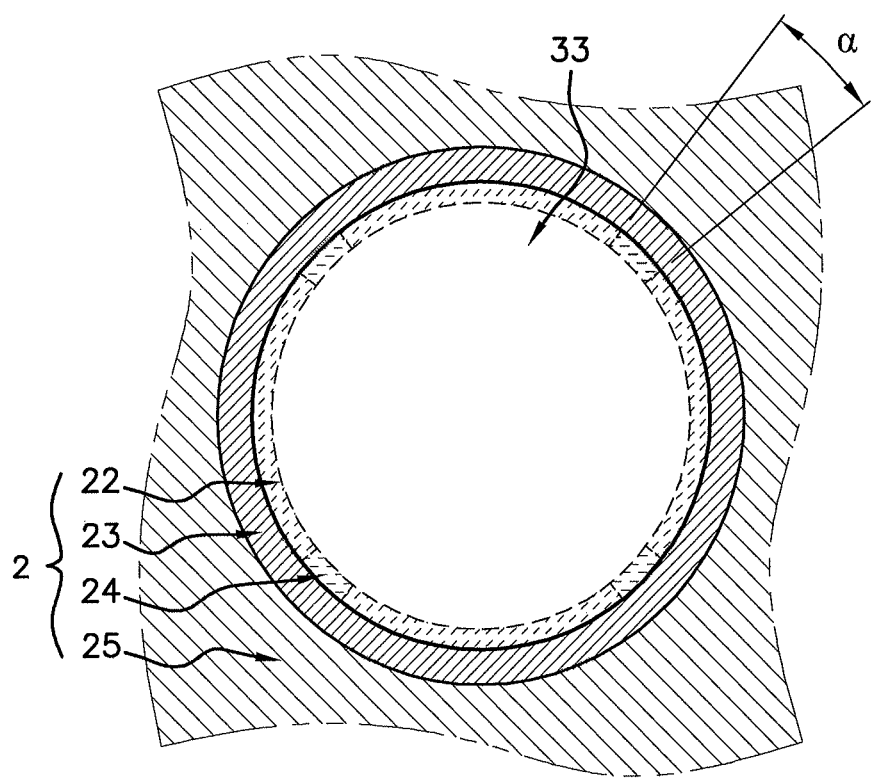
FIG. 4 schematically shows a top view of FIG. 3.

In a first embodiment, with reference to FIGS. 2 to 4, a mark 24 extends from the edge of the mounting aperture 22 up to a control end 24-1. The control end 24-1 of the mark 24 is then the distal end of the mark 24 with respect to the mounting aperture 22.

In this example, a mark 24 takes the shape of an annular sector. The mark 24 extends radially over a length L1, preferably of the order of 0.1 mm. A mark 24 extends, depending on its width, which is preferably comprised between 0.3 mm and 0.6 mm, over a sector of the conduction zone 23, having an angle α. Although a mark 24 taking the shape of an annular sector is presented, it goes without saying that any other shape extending up to a control end could be suitable, for example a triangular shape.

In the example of FIG. 4, four marks 24 extend from the edge of a mounting aperture 22. The dimensions of the marks 24 are determined such that the contact area between the electrical conduction zone 23 and the head 33 of the rivet 32 is sufficient to make the electrical connection. Thus, the marks 24 make it possible to control that riveting has been done correctly when the control end 24-1 of the marks 24 is covered by the head 33 of the rivet 32. Stated otherwise, when the marks 24 are covered by the rivet 32, the contact area between the rivet 32 and the electrical conduction zone 23 is sufficient to provide ground continuity, as well as the correct conformity of riveting.

In this preferred example, each electrical conduction zone 23 comprises four marks 24, thus making it possible to control the centering of the riveting in each of the four main angular directions (0°, 90°, 180° and 270°). Specifically, in this case, when all of the marks 24 are covered by the rivet 32, it is deduced therefrom that the rivet 32 is correctly centered, i.e. in all four directions, with respect to the mounting aperture 22.

It will be noted that an electrical conduction zone 23 could contain more or fewer than four marks 24, for example one, two, three, five or more as long as this or these marks do not completely cover the area of the edge of the aperture 22 so as to allow electrical ground conduction between the conduction zone 23 and the rivet 32.

In this example, the marks 24 are made using varnish so as to produce them at the same time as the protective layer 25, thereby facilitating the production thereof.

Figure 5:
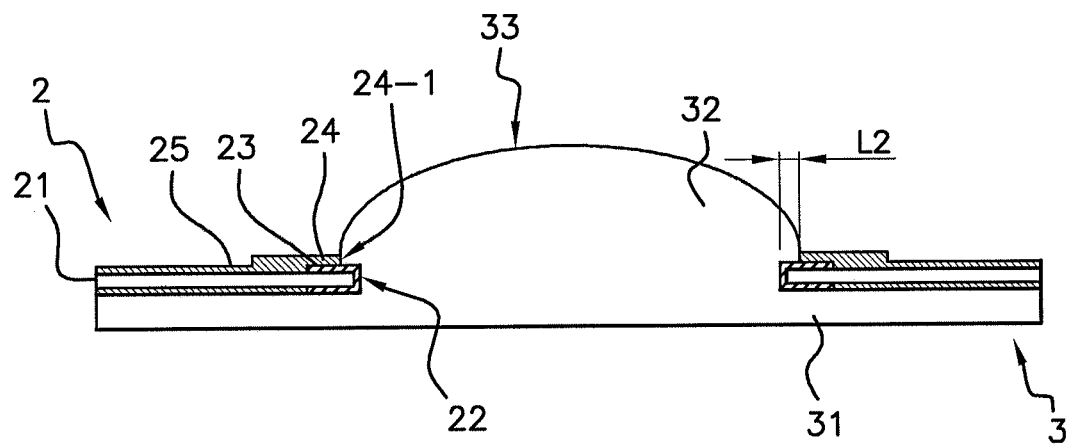
FIG. 5 schematically shows a sectional view of a second embodiment of a riveted printed circuit board.
Figure 6:
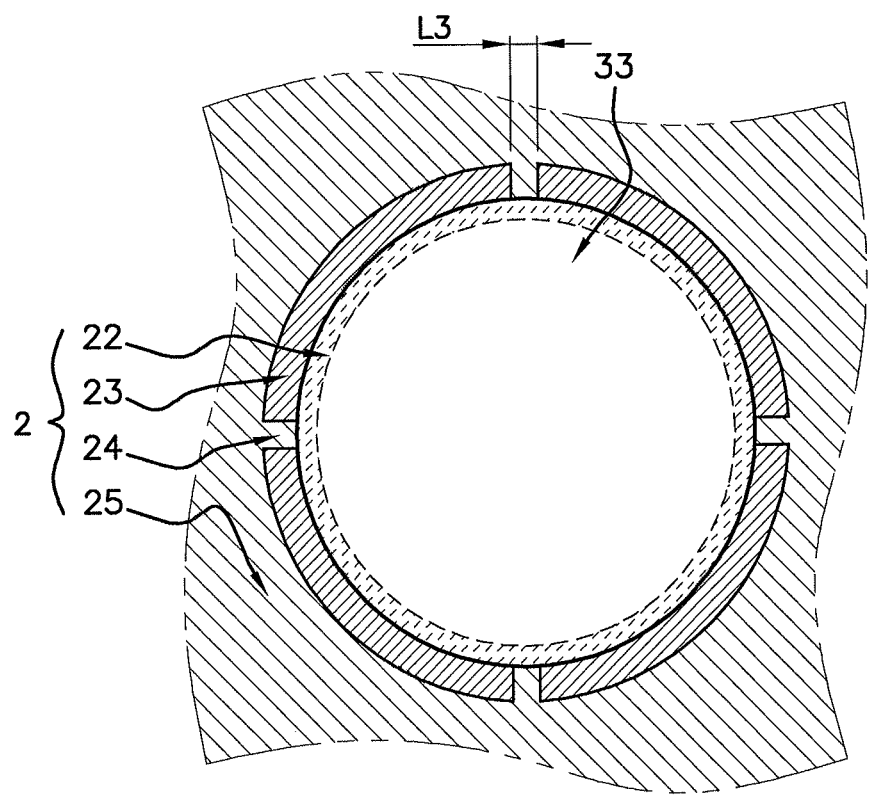
FIG. 6 schematically shows a top view of FIG. 5.

In a second embodiment, with reference to FIGS. 5 to 6, a mark 24 extends from the edge of the conduction zone 23 up to a control end 24-1 located a distance L2 away from the edge of the aperture 22, of the order of 0.1 mm. The control end 24-1 of the mark 24 is then the proximal end of the mark 24 with respect to the aperture 22.

Stated otherwise, the mark 24 covers a portion of the conductive zone 23 that is not used for electrical connection with the rivet 32. Preferably, a mark 24 extends over a width L3, comprised between 0.3 mm and 0.6 mm. In this embodiment, the rivet 32 makes contact with the electrical conduction zone 23 over the entire edge of the aperture 22, which makes it possible to optimize their contact area and hence the electrical connection thereof. Moreover, such a mark 24 is made of the same material as the protective layer 25 of the printed circuit board 2, thereby making the mark 24 resistant and facilitating its production.

The mark 24 makes it possible to control that riveting has been done correctly when the control end 24-1 of said mark 24 is covered by the head 33 of the rivet 32. Stated otherwise, when the end of the mark 24 is covered by the rivet 32, the contact area between the rivet 32 and the electrical conduction zone 23 is sufficient to provide ground continuity. In a similar manner to the first embodiment, each electrical conduction zone 23 comprises four marks 24, thus making it possible to control the centering of the riveting in each of the four main angular directions (0°, 90°, 180° and 270°).

It will be noted that an electrical conduction zone 23 could contain more or fewer than four marks 24, for example one, two, three, five or more.

According to one advantageous aspect of the invention, the riveting may be controlled automatically using a module (not shown) for determining the coverage of the control end 24-1 of a mark 24.

In one preferred embodiment, the determining module comprises a camera for acquiring at least one image of the head 33 of the rivet 32 and an analysis submodule suitable for analyzing the one or more images captured by the camera so as to determine the coverage or otherwise of the control end 24-1 of the mark 24 by the head 33 of the rivet 32 and thus the conformity or otherwise of riveting.

In the rest of the description, the implementation of the method according to an aspect of the invention for mounting a printed circuit board 2 will be presented. For the sake of clarity, mounting using a single rivet 32 is presented.

It will be noted that such a method may be partially or fully automated.

The printed circuit board 2 is first positioned, in a step E1, on the carrier structure 3. To do this, the rivet 32 of the carrier structure 3 is inserted into a mounting aperture 22. Thus, the rivet 32 extends through the mounting aperture 22 prior to riveting.

Next, the rivet 32 is riveted, for example using a press, in a step E2, by flattening the head 33 of the rivet 32 onto the electrical conduction zone 23.

The riveting is then controlled so as to determine the conformity of riveting, in a step E3.

To do this, in one advantageous embodiment, the camera captures, in a step E3A, at least one image of the head 33 of the rivet 32. Next, the analysis module determines, in a step E3B, by analyzing the captured image, whether the control end 24-1 of each mark 24 is covered by the head 33 of the rivet 32.

If so, the determining module determines that the riveting is acceptable. Similarly, when the control end 24-1 of each mark 24 is covered by the head 33 of the rivet 32, the determining module determines that the rivet 32 is centered with respect to the mounting aperture 22.

The automatic control of riveting using a determining module has been presented, but it goes without saying that this control could be performed visually by an operator. Thus, in the absence of a module for determining the conformity of riveting, an operator may proceed in a similar manner, i.e. observe whether the control end 24-1 of each mark 24 is covered by the head 33 of the rivet 32, so as to determine the conformity of riveting, or even the correct centering thereof.

By virtue of the riveting method according to an aspect of the invention, the control of the riveting of the printed circuit board to the carrier structure is facilitated by analyzing the coverage of the control ends of the marks.

It should be noted that the present invention is not limited to the examples described hereinabove, and is open to many variants that are accessible to those skilled in the art. In particular, the shapes and dimensions of the elements of the printed circuit board 2, of the rivets 32 and of the marks 24 as shown in the figures so as to illustrate an exemplary embodiment of an aspect of the invention, should not be interpreted as being limiting.

The invention claimed is:

1. A method for mounting a printed circuit board for an automotive vehicle on a carrier structure for said printed circuit board, said carrier structure comprising at least one rivet, said rivet comprising a head that is capable of being flattened so as to attach the printed circuit board to the carrier structure, the printed circuit board comprising at least one mounting aperture that is capable of accommodating said rivet and which defines an electrical conduction zone and at least one mark comprising a control end up to which said mark extends over said electrical conduction zone, the method comprising:
   a step of positioning the printed circuit board on the carrier structure such that the rivet extends through the mounting, aperture;
   a step of riveting the rivet such that its head is at least partly flattened on the electrical conduction zone; and
   a step of determining the conformity of riveting when the head of the rivet covers the control end of the mark.

2. The method as claimed in claim 1, wherein the determining step is performed by a human operator.

3. The method as claimed in claim 1, wherein a module for determining the conformity of riveting is used in the step of determining the conformity of riveting, said determining module comprising at least one camera and one analysis submodule, the determining step comprising a substep of the camera acquiring at least one image of the head of the rivet and a substep of the analysis submodule analyzing the image to determine the coverage of the control end of the mark by the head of the rivet.

4. A printed circuit board for an automotive vehicle, the circuit board comprising:
    an aperture for mounting on a carrier,
    an electrical conduction zone on a periphery of said mounting aperture,
    and at least one mark comprising a control end up to which said mark extends over the electrical conduction zone,
    wherein the printed circuit board is at least partly covered by a protective layer defining the electrical construction zone, to implement a method comprising:
    positioning the printed circuit board on the carrier structure such that a rivet extends through the mounting aperture;
    riveting the rivet such that its head is at least partly flattened on the electrical conduction zone;
    and determining the conformity of riveting when the head of the rivet covers the control end of the mark.

5. The printed circuit board as claimed in claim 4, wherein the mark extends from said protective layer.

6. The printed circuit board as claimed in claim 4, wherein the mark extends from the mounting aperture.

7. The printed circuit board as claimed in claim 4, comprising a plurality of marks distributed evenly around the mounting aperture.

8. A computer for an automotive vehicle, comprising:
    a printed circuit board as claimed in claim 4, and
    at least one rivet for attaching the printed circuit board, said rivet covering the control end.

9. An automotive vehicle comprising a computer as claimed in claim 8.

10. The printed circuit board as claimed in claim 4, wherein the protective layer is a varnish.

* * * * *